(12) United States Patent
Kamimura

(10) Patent No.: US 9,070,636 B2
(45) Date of Patent: Jun. 30, 2015

(54) CLEANING AGENT FOR SEMICONDUCTOR SUBSTRATE, CLEANING METHOD USING THE CLEANING AGENT, AND METHOD FOR PRODUCING SEMICONDUCTOR ELEMENT

(75) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 910 days.

(21) Appl. No.: 13/245,096

(22) Filed: Sep. 26, 2011

(65) Prior Publication Data

US 2012/0073610 A1 Mar. 29, 2012

(30) Foreign Application Priority Data

Sep. 27, 2010 (JP) ................................. 2010-215454

(51) Int. Cl.
| | | |
|---|---|---|
| *H01L 21/311* | (2006.01) | |
| *G03F 7/42* | (2006.01) | |
| *H01L 21/02* | (2006.01) | |
| *C11D 11/00* | (2006.01) | |

(52) U.S. Cl.
CPC ...... *H01L 21/31133* (2013.01); *C11D 11/0047* (2013.01); *G03F 7/423* (2013.01); *H01L 21/02071* (2013.01)

(58) Field of Classification Search
CPC .................................................. C11D 11/0047
USPC ................................................. 510/175, 176
See application file for complete search history.

(56) References Cited

U.S. PATENT DOCUMENTS

| | | | |
|---|---|---|---|
| 6,475,708 B2 * | 11/2002 | Machac et al. ................ 430/331 |
| 6,927,237 B2 * | 8/2005 | Hei et al. ...................... 514/557 |
| 8,084,363 B2 * | 12/2011 | Amanokura et al. .......... 438/692 |
| 2002/0068244 A1 * | 6/2002 | Machac et al. ................ 430/331 |
| 2005/0090419 A1 * | 4/2005 | Delcomyn et al. ............ 510/372 |
| 2006/0110690 A1 | 5/2006 | Haraguchi et al. |
| 2007/0089761 A1 * | 4/2007 | Banerjee et al. ................ 134/34 |
| 2008/0248651 A1 * | 10/2008 | Suzuki et al. ................. 438/703 |
| 2009/0156007 A1 * | 6/2009 | Amanokura et al. .......... 438/693 |
| 2009/0192065 A1 | 7/2009 | Korzenski et al. |
| 2012/0108485 A1 | 5/2012 | Kamimura |

FOREIGN PATENT DOCUMENTS

| | | |
|---|---|---|
| JP | 7-321080 A | 12/1995 |
| JP | 2004186208 A | 7/2004 |
| JP | 2008547050 A | 12/2008 |
| WO | 2004008249 A2 | 1/2004 |

OTHER PUBLICATIONS

Communication, dated Nov. 26, 2013, issued in corresponding EP Application No. 11182691.3, 5 pages in English.
Notice of Reasons for Rejection, dated Feb. 18, 2014, issued in corresponding JP Application No. 2010-215454, 7 pages in English and Japanese.

\* cited by examiner

*Primary Examiner* — Gregory Webb
(74) *Attorney, Agent, or Firm* — Sughrue Mion, PLLC

(57) ABSTRACT

A cleaning agent for a semiconductor substrate, which is capable of exerting cleaning power equivalent to that of an SPM cleaning agent, greatly improving damage of a semiconductor substrate by the SPM cleaning agent, and efficiently stripping and removing impurities adhered to the surface of the semiconductor substrate, particularly attached substances such as an ion-implanted resist, a cleaning method using the cleaning agent, and a method for producing a semiconductor element are provided. The cleaning agent for a semiconductor substrate comprises sulfuric acid, hydrogen peroxide and an alkylene carbonate. The method for cleaning a semiconductor substrate comprises cleaning the semiconductor substrate with sulfuric acid, hydrogen peroxide and an alkylene carbonate in combination.

7 Claims, No Drawings

CLEANING AGENT FOR SEMICONDUCTOR SUBSTRATE, CLEANING METHOD USING THE CLEANING AGENT, AND METHOD FOR PRODUCING SEMICONDUCTOR ELEMENT

BACKGROUND OF THE INVENTION

1. Field of the Invention

The present invention relates to a cleaning agent for a semiconductor substrate, a cleaning method using the cleaning agent, and a method for producing a semiconductor element.

2. Description of the Related Art

Production steps of a semiconductor element (semiconductor device) include various steps such as a lithography step, an etching step, and an ion implantation step (ion implantation). After completion of each step, prior to moving to a next step, a cleaning treatment for cleaning a surface of a substrate is carried out by stripping and removing attached substances such as a resist, fine particles, metal impurities and a spontaneous oxide film on the surface of the substrate.

A process of cleaning a surface of a substrate by stripping attached substances such as a resist using a mixed solution of sulfuric acid and hydrogen peroxide (hereinafter referred to as an "SPM") is widely used as the conventional cleaning treatment method (refer to JP1995-321080A (JP-H07-321080A)).

SUMMARY OF THE INVENTION

The conventional cleaning method using the SPM is advantageous in the aspect of favorable stripping property of attached substances, but oxidation powder of the SPM is too strong. Therefore, a gate insulating film constituted of a high dielectric (high-k) material and a substrate itself may break during cleaning. Considering the recent circumstances in which a size of a semiconductor device is decreased, even local occurrence of such breakage results in deterioration of electric characteristics. For this reason, the problem on the substrate breakage has been desired to be improved while maintaining strong cleaning power of the SPM as possible. Moreover, in recent years, the amount of ion implanted tends to be increased in an ion implantation step which is one of production steps of a semiconductor element. In such a case, an ion-implanted resist is carbonized or crosslinked, thereby the outermost surface is deteriorated. As a result, the complete stripping of the ion-implanted resist becomes further difficult, depending on chemicals or the like used. In other words, both removal of a deteriorated resist highly ion-implanted and reduction in breakage of an element substrate are further difficult to achieve simultaneously.

The present invention has been made in view of the above actual circumstances, and has an object to provide a cleaning agent for a semiconductor substrate, which can exert cleaning power equivalent to that of an SPM cleaning agent, can greatly improve damage of a semiconductor substrate by the SPM cleaning agent, and can efficiently strip and remove impurities adhered to the surface of the semiconductor substrate, particularly attached substances such as an ion-implanted resist, a cleaning method using the cleaning agent, and a method for producing a semiconductor element.

A cleaning agent for a semiconductor substrate according to the present invention, that can overcome the above problems comprises sulfuric acid, hydrogen peroxide and an alkylene carbonate.

The preferred embodiments of the present invention are that the alkylene carbonate is ethylene carbonate or propylene carbonate, and the alkylene carbonate is used in an amount of from 10 to 95% by mass based on the total mass of the cleaning agent.

Additionally, the preferred embodiment of the present invention is that the cleaning agent is a multi-component kit comprising a combination of sulfuric acid, hydrogen peroxide and the alkylene carbonate, or a two-component kit comprising a mixture of hydrogen peroxide and the alkylene carbonate, and sulfuric acid.

The preferred embodiments of the present invention are that the cleaning composition further comprises a sulfonate group-containing compound, and the mixture further comprises a sulfonate group-containing compound.

The present invention further includes a method for cleaning a semiconductor substrate, comprising cleaning the semiconductor substrate with sulfuric acid, hydrogen peroxide and an alkylene carbonate.

The preferred embodiments of the present invention are that the cleaning method comprises a first step of cleaning the semiconductor substrate with a mixture of the alkylene carbonate and hydrogen peroxide, or with the alkylene carbonate, and a second step of cleaning the semiconductor substrate with a mixture of sulfuric acid, hydrogen peroxide and the alkylene carbonate, and the mixture used in the second step further comprises a sulfonate group-containing compound.

The present invention further includes a method for producing a semiconductor element, wherein a semiconductor substrate is produced through a step of cleaning the semiconductor substrate with the cleaning method.

A cleaning agent for a semiconductor substrate according to the present invention can exert cleaning power equivalent to or more than that of an SPM cleaning agent, and can efficiently strip and remove impurities adhered to the surface of the semiconductor substrate, and an ion-implanted resist. Furthermore, the cleaning agent for a semiconductor substrate of the present invention can greatly improve the damage of the semiconductor substrate by a cleaning agent.

A cleaning method and a production method of a semiconductor element, using the cleaning agent for a semiconductor substrate can greatly improve production quality and production efficiency in the production of a semiconductor element.

DESCRIPTION OF THE PREFERRED EMBODIMENTS

A cleaning agent for a semiconductor substrate according to the present invention uses sulfuric acid, hydrogen peroxide and an alkylene carbonate in combination. Use of the cleaning agent greatly reduces the damage to an element substrate while maintaining strong cleaning power inherent in SPM. The reason for this is presumed as follows. When an alkylene carbonate is introduced in an SPM cleaning agent system, surface protection property of a semiconductor substrate is exerted as compared with, for example, the case of introducing water alone in place of the alkylene carbonate. At the same time, when an acid is co-present in the cleaning agent system or as necessary, heat is applied during cleaning, the alkylene carbonate decomposes to generate bubbles of carbonate, and the bubbles promote cleaning while physically destroying the structure of attached substances. As a result, physical strip-cleaning power is exerted while suppressing chemical cleaning action, and it is considered that both the improvement in cleaning power and the improvement in resistance to damage of a substrate can be achieved.

The cleaning agent according to the present invention may be that (a) sulfuric acid, (b) hydrogen peroxide and (c) alkylene carbonate are previously mixed, and the resulting mixture is stored, but may be that the cleaning agent is constituted of a three-component kit comprising the respectively separated component (a), component (b) and component (c), or a two-component kit comprising an appropriate combination of those, and the respective components in each kit are mixed just before cleaning the semiconductor substrate. The two-component kit includes an embodiment constituted of a mixture of the component (b) and the component (c), and the component (a). The preferred embodiment of the present invention is described in detail below by reference to the example of the multi-component cleaning agent. The term "semiconductor substrate" used herein is used as a collective term of intermediates (precursors) for producing a semiconductor element, and means to include not only silicon wafers but also intermediate products before mounting, equipped herewith an insulating film, an electrode and the like.

Sulfuric Acid

The amount of sulfuric acid used in the present invention is not particularly limited, but is preferably from 5 to 50% by mass, and more preferably from 5 to 40% by mass, in terms of 98 mass % sulfuric acid aqueous solution, based on the total mass of the cleaning agent (after mixing) for the purpose of obtaining high cleaning power. The mixing ratio of hydrogen peroxide and sulfuric acid varies depending on their concentrations, but considering general setup, 30 to 300 parts by mass of 98 mass % sulfuric acid aqueous solution are preferably mixed with 100 parts by mass of 30 mass % hydrogen peroxide solution. When the cleaning liquid of the present invention is prepared using a sulfuric acid aqueous solution, the concentration of the sulfuric acid aqueous solution used is not particularly limited, but is preferably from 30 to 100% by mass, and more preferably from 50 to 100% by mass, from the standpoint of exerting high cleaning power.

Hydrogen Peroxide

The amount of hydrogen peroxide used in the present invention is not particularly limited, but is preferably from 5 to 50% by mass, and more preferably from 5 to 40% by mass, in terms of 30 mass % hydrogen peroxide solution, based on the total mass of the cleaning agent (after mixing) from the standpoint of exerting high cleaning power. The preferred mixing ratio of sulfuric acid and hydrogen peroxide is the range as described above. When the cleaning liquid of the present invention is prepared using a hydrogen peroxide solution, the concentration of the hydrogen peroxide solution used is not particularly limited, but is preferably from 10 to 50% by mass, and more preferably from 15 to 50% by mass, from the standpoint of exerting high cleaning power.

Alkylene Carbonate

Examples of the alkylene carbonate used in the present invention include ethylene carbonate and propylene carbonate. The alkylene carbonate may have a substituent in a range of not impairing the effect of the present invention. The alkylene carbonate may be used alone or as mixtures of two or more thereof.

In the present invention, the form of the alkylene carbonate is not particularly limited, and may be a molten liquid, a solution of alykene carbonate dissolved in a predetermined solvent, or a powder. For example, ethylene carbonate is solid at room temperature, and can be melted by heating to 40° C. or higher.

The solvent used to prepare the solution of alkylene carbonate is not particularly limited so long as it can dissolve the alkylene carbonate. Examples of the solvent used include polar solvents such as water, ethanol, methanol, ethylene glycol and propylene glycol.

The amount of the alkylene carbonate used in the present invention is not particularly limited, but is preferably from 10 to 95% by mass, and more preferably from 30 to 90% by mass, based on the total mass of the cleaning agent (after mixing) for the purpose of achieving both high cleaning power and protective power of a substrate. When the amount of the alkylene carbonate used is 10% by mass or larger, the proportion of SPM content is relatively decreased, and the cleaning agent of the present invention can inhibit damage to a substrate. When the amount of the alkylene carbonate used is 95% by mass or smaller, a resist having been deteriorated by implantation can effectively be removed.

The mixing ratio of sulfuric acid and the alkylene carbonate varies depending on their concentrations, but considering general condition setting of SPM, the alkylene carbonate is mixed with sulfuric acid in an amount of preferably from 50 to 2,000 parts by mass, and more preferably from 100 to 1,000 parts by mass, relative to 100 parts by mass of 98 mass % sulfuric acid aqueous solution.

Other Components

Carbonate

The cleaning agent of the present invention may further contain any other components, in addition of the above components, and specific example of the other component is carbonate. The carbonate is a compound generating carbon dioxide by the action of an acidic compound, and acts as a so-called decomposable foaming agent.

The carbonate used is not particularly limited so long as it is a compound generating carbonic acid. Examples of the carbonate include normal salt, acidic salt (hydrogen carbonate) and basic salt (hydroxide carbonate salt). Examples of the carbonate specifically include carbonates of alkali metals and alkaline earth metals, hydrogen carbonates of alkali metals and alkaline earth metals, and ammonium carbonate. More specifically, examples of the carbonate include sodium carbonate, potassium carbonate, cesium carbonate, lanthanum carbonate, lithium carbonate, magnesium carbonate, manganese carbonate, nickel carbonate, strontium carbonate, aminoguanidine carbonate, guanidine carbonate, sodium hydrogen carbonate, potassium hydrogen carbonate, ammonium carbonate and ammonium hydrogen carbonate. Furthermore, anhydrous salts, hydrated salts and their mixtures can be used. Of those, ammonium carbonate and ammonium hydrogen carbonate are preferably used from the standpoint of excellent strippability of attached substances and easy handling property, and ammonium carbonate is more preferably used. The carbonate may be used alone or as mixtures of two or more thereof.

The carbonate is used in an amount of preferably from 0.1 to 30% by mass, and more preferably from 0.5 to 30% by mass, based on the mass of the cleaning agent (total mass after mixing).

The carbonate may be dissolved in a solvent. The solvent for dissolving the carbonate is not particularly limited so long as it does not impair the effect of the present invention. Examples of the solvent used include water and an organic solvent (for example, polar solvent such as DMSO, DMF or NMP). The amount of the solvent used is not particularly limited, but is preferably from 1 to 100 parts by mass, and more preferably from 10 to 99 parts by mass, relative to one part by mass of the carbonate. When the carbonate is used in a form of a solution, the pH of the solution is not particularly limited, but is preferably from 7.5 to 12.0, and more preferably from 8.0 to 11.0, from that stability of a foaming agent component is further excellent and stripping property of attached substances is further excellent.

Acidic Compound

The cleaning agent of the present invention may further comprise optional acidic compound. The acidic compound used is not particularly limited. Examples of the acidic compound used include nitric acid, boric acid, phosphoric acid, formic acid, acetic acid, propionic acid, benzoic acid, glycolic acid, salicyclic acid, glyceric acid, oxalic acid, malonic acid, succinic acid, glutaric acid, adipic acid, pimelic acid, maleic acid, phthalic acid, malic acid, tartaric acid, citric acid, lactic acid, glycine, alanine, asparaginic acid, glutamic acid, aminomethanesulfonic acid, taurine, benzenesulfonic acid, toluenesulfonic acid, methanesulfonic acid, ethanesulfonic acid and sulfamic acid. The acidic compound may be used alone or as mixtures of two or more thereof. Above all, a sulfonate group-containing compound is preferably used in combination.

The amount of the acidic compound used is not particularly limited, but is preferably from 0.01 to 30% by mass, and more preferably from 0.01 to 10% by mass, based on the mass of the cleaning agent (total mass after mixing). When the acidic compound is used by dissolving in a solvent, the solvent can appropriately be selected. For example, the solvents and conditions applied to the carbonate can be used.

Surfactant

The cleaning agent of the present invention may further comprise a surfactant. The surfactant used is not particularly limited. Examples of the surfactant include a cationic surfactant, an amphoteric surfactant, a nonionic surfactant and an anionic surfactant. The nonionic surfactant or the anionic surfactant is preferably used in that stripping property of attached substances is further excellent and reattachment of the attached substances stripped from a substrate surface to the substrate surface is inhibited, and the nonionic surfactant is particularly preferably used in that those effects are further excellent. The surfactant can use any of a linear surfactant and a branched surfactant. The surfactant is used in an amount of preferably from 0.00005 to 5% by mass, and more preferably from 0.0005 to 0.5% by mass, based on the mass of the cleaning agent (total mass after mixing).

Oxidizing Agent

The cleaning agent according to the present invention may further comprise an oxidizing agent. The oxidizing agent used is not particularly limited. Examples of the oxidizing agent used include a peroxide other than hydrogen peroxide, a nitrate, a persulfate, a bichromate and a permanganate. Of those, the peroxide is preferably used from the standpoint of excellent stripping property of attached substances and easy handling. The oxidizing agent is used in an amount of preferably from 0.005 to 10% by mass, and more preferably from 0.05 to 10% by mass, based on the mass of the cleaning agent (total mass after mixing).

Alkaline Compound

The cleaning agent according to the present invention may further comprise an alkaline compound. The alkaline compound used is not particularly limited. Examples of the alkaline compound used include tetramethylammonium hydroxide, tetraethylammonium hydroxide, tetrapropylammonium hydroxide and tetrabutylammonium hydroxide. The amount of the alkaline compound used is not particularly limited. However, the alkaline compound is used in an amount of preferably from 0.0001 to 10% by mass, and more preferably from 0.0001 to 5% by mass, based on the mass of the cleaning agent (total mass after mixing).

The components constituting the cleaning agent of the present invention should not exceed 100% by mass in total.

Of the above-described components used in the cleaning agent of the present invention, sulfuric acid and the acidic compound are provided separate from the peroxide such as hydrogen peroxide, the alkylene carbonate, and the foaming component such as the carbonate, and those components are preferably used by mixing just before cleaning a semiconductor substrate. The reason for this is to sufficiently obtain the stripping effect of attached substances by foaming the foaming components in cleaning the semiconductor substrate.

Cleaning Method of Semiconductor Substrate

The cleaning method of a semiconductor substrate using the cleaning agent (more preferably a multi-component (e.g., two-component or three-component) kit) of the present invention is a method comprising preparing a cleaning agent by mixing the above-described components, heating the cleaning agent to a predetermined temperature (preferably from 40 to 150° C., and more preferably from 50 to 100° C.), dipping a semiconductor substrate having been subjected to a predetermined processing on a silicon wafer in the cleaning agent bath, and performing cleaning. Alternatively, the semiconductor substrate may be cleaned by supplying the cleaning liquid to the semiconductor substrate through a cleaning line. The cleaning time is not particularly limited. Considering the sufficient cleaning, the cleaning time is preferably from 1 to 30 minutes.

The cleaning method of the present invention may further comprise a preliminary step (first step) of cleaning a semiconductor substrate using at least alkylene carbonate before a step (second step) of cleaning the semiconductor substrate using the cleaning agent. By the preliminary step, the alkylene carbonate is adhered to the surface of the semiconductor substrate, thereby protecting the substrate surface. As a result, the substrate is difficult to be broken in the subsequent second step.

The cleaning agent used in the preliminary step should contain at least an alkylene carbonate, and examples of the cleaning agent include a cleaning agent comprising the alkylene carbonate, and a cleaning agent further comprising hydrogen peroxide. The cleaning agent may contain other components exemplified above, but it is preferred that the contents of sulfuric acid and an acidic compound are kept low. Specifically, the content of sulfuric acid and the acidic compound is preferably 3% or lower by mass, more preferably 1% or lower by mass, further preferably 0.5% or lower by mass and most preferably 0% by mass (that is, sulfuric acid and the acidic compound are not contained), based on 100% by mass of the cleaning agent for the preliminary step.

Production Method of Semiconductor Element

A semiconductor element is generally produced as follows. A gate insulating film constituted of a high dielectric material (such as $HfSiO_4$, $ZiO_2$, $ZiSiO_4$, $Al_2O_3$, $HfO_2$ or $La_2O_3$), a gate electrode layer constituted of polysilicon, and the like are formed on a silicon substrate (for example, ion-implanted n-type or p-type silicon substrate) using a technique such as sputtering (step of forming a layer to be etched). Next, a resist is applied to the formed gate insulating film and gate electrode layer, and a predetermined pattern is formed by photolithography. After formation of the pattern, the resist on an unnecessary portion is developed and removed (resist development step), and non-mask region is subjected to dry etching or wet etching using the resist pattern as a mask (etching step), thereby removing the gate insulting film, the gate electrode layer and the like. Ionized p-type or n-type impurity elements are then implanted to the silicon substrate in an ion implantation treatment (ion implantation step), and a p-type or n-type impurity-implanted region (so-called source/drain region) is formed on the silicon substrate. As necessary, after an aching treatment (aching step) is carried out, a residual resist film on the substrate is stripped.

The cleaning method using the cleaning agent for a semiconductor substrate of the present invention is a method which is carried out during the production of a semiconductor element, and may be carried out after any step described above. Specifically, the cleaning method can be carried out after resist development, dry etching, wet etching, ashing, ion implantation and the like. In particular, the cleaning method is preferably carried out after the ion implantation step (ion implantation) from the standpoint that stripping property of a resist carbonized by ion implantation is good. More specifically, the cleaning agent of the present invention is preferably applied to a semiconductor substrate obtained through a step of preparing a semiconductor substrate (for example, p-type or n-type silicon substrate) having a layer to be etched (gate insulating film and/or gate electrode layer) formed on the surface thereof (step of forming a layer to be etched), a step of forming a photoresist pattern on the upper part of the layer to be etched (resist formation step), a step of selectively etching the layer to be etched using the photoresist pattern as an etching mask (etching step), and a step of conducting ion implantation (ion implantation step). The ion implantation step can be carried out by the conventional method, and can be conducted in a dose of from $10^{15}$ to $10^{18}$ atoms/cm$^2$ utilizing an ion such as argon, carbon, neon or arsenic.

Other preferred embodiment of the cleaning method using the cleaning agent for a semiconductor substrate of the present invention is a method of carrying out the ion implantation step as described above, followed by removing large dusts on a substrate and a bulk layer by the ashing treatment or the conventional cleaning liquid to the substrate, and then using the cleaning agent for a semiconductor substrate of the present invention to dusts and various layers that are difficult to be removed. The ashing treatment can be conducted with the conventional method, and example of the ashing treatment includes a method of using plasma gas. The cleaning method of the present invention may repeatedly be carried out to the same substrate. For example, by conducting the cleaning two times or more (for example, two times or three times), the effect of one time or more cleaning is obtained.

Semiconductor Substrate

The semiconductor substrate (substrate for a semiconductor element) which is a product to be cleaned by the cleaning method can use a semiconductor substrate in any stage in the above production steps. The product to be cleaned includes a semiconductor substrate having a resist (particularly, a resist having been subjected to ion implantation) on the surface thereof. When the cleaning agent of the present invention is used, residues generated during ashing (ashing residues), residues generated during etching (etching residues) and other impurities, other than the resist (or pattern resist) can be stripped and removed from the substrate having those on the surface thereof.

The semiconductor substrate used in the present invention may have, other than the resist, an insulating film such as a silicon oxide film or a silicon nitride film, a tantalum nitride layer (TaN), a titanium nitride layer (TiN), a hafnium oxide layer (HfO$_2$), a lanthanum oxide layer (La$_2$O$_3$), an aluminum oxide layer (Al$_2$O$_3$), a polysilicon, or doped (dope element: argon, carbon, neon, arsenic or the like) silicon on a part of the surface thereof or on the entire surface thereof. The semiconductor substrate means a member comprising a semiconductor material (for example, silicon substrate). The semiconductor substrate is not limited to a plate-like substrate, and a semiconductor having any shape is included in the "semiconductor substrate" so long as it is a semiconductor material.

The resist deposited on the semiconductor substrate uses the conventional resist material, and examples thereof include positive type, negative type and positive-negative dual photoresists. Specific examples of the positive type resist include vinyl cinnamate type, cyclized polyisobutylene type, azo-novolak resin type, and diazoketone-novolak resin type. Specific examples of the negative type resist include azide-cyclized polyisoprene type, azide-phenol resin type, and chloromethyl polystyrene type. Specific example of the positive-negative dual resist includes poly(n-butoxycarboxyloxystyrene).

The cleaning method of the present invention is preferably included in a production method of a semiconductor element. The cleaning method can be used in the cleaning of a semiconductor substrate in which wiring width is so very fine that the conventional cleaning agent could not be applied thereto. Additionally, because damage to High-k film or the like is small, the cleaning agent can preferably be used in the production of small-sized and high performance electronic parts such as LCD, memory and CPU. Furthermore, the cleaning agent can preferably be used in the production of a semiconductor substrate using a porous material susceptible to damage, such as Ultra-low-k which is under development as an insulating film for the next generation.

The present invention is described in more detail below by reference to the following Examples, but it should be understood that the invention is not construed as being limited to those Examples.

Preparation of Silicon Wafer Having Bulk Layer

KrF resist layer (film thickness: 0.3 µm (3,000 angstroms)) was provided on a silicon wafer. Arsenic (As) was ion-implanted from an angle of 0° under the conditions of 5 keV and 1e15 to prepare a silicon wafer having a bulk layer (resist layer on which a hardened layer and a deteriorated layer are not almost formed).

Preparation of Silicon Wafer Having Hardened Layer

KrF resist layer (film thickness: 0.3 µm (3,000 angstroms)) was provided on a silicon wafer. Arsenic (As) was ion-implanted from an angle of 45° under the conditions of 5 keV and 1e15 to prepare a silicon wafer having a hardened layer (resist layer on which a hardened layer and a deteriorated layer were formed).

Preparation of Semiconductor Substrate Sample

Al$_2$O$_3$ layer, TiN layer, HfO$_2$ layer and SiGe layer (Ge content: 40% by mass) were formed on a silicon wafer in a thickness of 50 angstroms, respectively. Thus, four kinds of semiconductor substrate samples were prepared.

EXAMPLES, COMPARATIVE EXAMPLES AND REFERENCE EXAMPLES

Resist stripping property and influence to a substrate were evaluated using cleaning components 1 and 2 shown in Tables 1 to 3 below.

In detail, the cleaning components 1 and 2 were prepared, respectively, and those were mixed to prepare cleaning agents for a semiconductor substrate of the present invention. Specifically, explaining by reference to Example 1, ethylene carbonate was dissolved in 30 mass % hydrogen peroxide solution to prepare the cleaning component 1, and this was mixed with a 98 mass % sulfuric acid aqueous solution (cleaning component 2) to prepare a cleaning agent for a semiconductor substrate.

The cleaning agent prepared was adjusted to a predetermined temperature (70° C.), and the silicon wafer having a resist layer prepared above, four kinds of the semiconductor substrate samples prepared above, and an untreated silicon wafer were dipped in the cleaning agent for a predetermined time (5 minutes). The substrates were taken out and the following evaluation was conducted. The treatment temperature in Tables 1 to 3 means a temperature in the cleaning agent (mixed liquid).

Stripping Property of Resist

The surface (area: 3.0×3.0 µm) of the substrates was observed with a microscope, and evaluated based on the following standards. Practically, the stripping property evaluation preferably exceeds B.

AAA: Residual resist portion is less than 5%
AA: Residual resist portion is from 5% to less than 10%
A: Residual resist portion is from 10% to less than 30%
B: Residual resist portion is from 30% to less than 50%
B': Residual resist portion is from 50% to less than 80%
C: Residual resist portion is 80% or more Etching Rate (ER)

Etching rate (ER) to each film was calculated from difference in film thicknesses before and after the treatment. In the case that $Al_2O_3$ layer and the like on the wafer disappear within the dipping time (5 minutes) in the cleaning liquid, a value obtained by dividing a film thickness (50 angstroms) by the time required until disappearance of the layer was used as an etching rate.

Practically, the etching rate is preferably less than 50 angstroms/min, and more preferably less than 10 angstroms/min.

Doped Si-Loss

This is a value (angstroms) obtained by measuring loss thickness on the surface of the wafer (thickness lost by cleaning) in the case of using the untreated silicon wafer with ICP-MS (inductively-coupled plasma mass spectrometer, available from SHIMADZU), and then converting to a film thickness. Practically, the value is preferably less than 10 angstroms.

Ox Growth

This is a value (angstroms) obtained by measuring a thickness of a silicon oxide layer formed on the surface of the wafer in the case of using the untreated silicon wafer with ellipsometry (available from J. A. Woollam, VASE). Practically, the value is preferably less than 10 angstroms.

TABLE 1

| | Cleaning component 1 (g) | Cleaning component 2 (g) | Treatment temperature (°C.) | Resist stripping property (Bulk layer) | Resist stripping property (Hardened layer) | $Al_2O_3$ ER (A/min) | TiN ER (A/min) | $HfO_2$ ER (A/min) | SiGe40% ER (A/min) | Doped Si-Loss (A) | Ox growth (A) |
|---|---|---|---|---|---|---|---|---|---|---|---|
| Example 1 | Hydrogen peroxide (50) Ethylene carbonate (50) | Sulfuric acid (50) | 70 | B | AAA | 20 | 6 | <1 | 6 | <0.1 | 5 |
| Example 2 | Hydrogen peroxide (30) Ethylene carbonate (90) | Sulfuric acid (30) | 70 | AA | AAA | 15 | 5 | <1 | 6 | <0.1 | 4 |
| Example 3 | Hydrogen peroxide (20) Ethylene carbonate (110) | Sulfuric acid (20) | 70 | AAA | AAA | 10 | 3 | <1 | 4 | <0.1 | 3 |
| Example 4 | Hydrogen peroxide (10) Ethylene carbonate (130) | Sulfuric acid (10) | 70 | AAA | AA | 3 | 0.5 | <1 | 1 | <0.1 | 3 |
| Example 5 | Hydrogen peroxide (20) Ethylene carbonate (110) | Sulfuric acid (40) | 70 | AA | AAA | 10 | 3 | <1 | 4 | <0.1 | 4 |
| Example 6 | Hydrogen peroxide (40) Ethylene carbonate (110) | Sulfuric acid (20) | 70 | AA | AAA | 11 | 4 | <1 | 6 | <0.1 | 5 |
| Example 7 | Hydrogen peroxide (20) Ethylene carbonate (110) Dodecylbenzenesulfonic acid (0.5) | Sulfuric acid (20) | 70 | AAA | AAA | 5 | <1 | <1 | 4 | <0.1 | 2 |
| Example 8 | Hydrogen peroxide (20) Ethylene carbonate (110) Dodecylbenzenesulfonic acid (3) | Sulfuric acid (20) | 70 | AAA | AAA | 3 | <1 | <1 | 4 | <0.1 | 1 |
| Example 9 | Hydrogen peroxide (20) Ethylene carbonate (110) Disulfonic acid type surfactant (1) | Sulfuric acid (20) | 70 | AAA | AAA | 4 | <1 | <1 | 5 | <0.1 | 2 |
| Example 10 | Hydrogen peroxide (20) Ethylene carbonate (110) Polystyrenesulfonic acid (1) | Sulfuric acid (20) | 70 | AAA | AAA | 6 | <1 | <1 | 4 | <0.1 | 3 |
| Example 11 | Hydrogen peroxide (20) Ethylene carbonate (110) Polystyrenesulfonic acid (5) | Sulfuric acid (20) | 70 | AAA | AAA | 3 | <1 | <1 | 4 | <0.1 | 3 |
| Example 12 | Hydrogen peroxide (20) Propylene carbonate (110) | Sulfuric acid (20) | 70 | AAA | AAA | 10 | 3 | <1 | 4 | <0.1 | 3 |
| Example 13 | Hydrogen peroxide (20) Propylene carbonate (110) Dodecylbenzenesulfonic acid (3) | Sulfuric acid (20) | 70 | AAA | AAA | 3 | <1 | <1 | 4 | <0.1 | 1 |

TABLE 2

|  | Cleaning component 1 (g) | Cleaning component 2 (g) | Treatment temperature (° C.) | Resist stripping property (Bulk layer) | Resist stripping property (Hardened layer) | Al$_2$O$_3$ ER (A/min) | TiN ER (A/min) | HfO$_2$ ER (A/min) | SiGe40% ER (A/min) | Doped Si-Loss (A) | Ox growth (A) |
|---|---|---|---|---|---|---|---|---|---|---|---|
| Comparative Example 1 (SPM) | Hydrogen peroxide (75) | Sulfuric acid (75) | 70 | A | AAA | 480 | 30 | 8 | 30 | 10 | 50 |
| Comparative Example 2 (SPM) | Hydrogen peroxide (50) Water (50) | Sulfuric acid (50) | 70 | B' | A | Not evaluated | | | | | |
| Comparative Example 3 (SPM) | Hydroge peroxide (30) Water (90) | Sulfuric acid (30) | 70 | C | B | 150 | 16 | 5 | 15 | 3 | 20 |
| Comparative Example 4 (SPM) | Hydrogen peroxide (20) Water (110) | Sulfuric acid (30) | 70 | C | B' | 80 | 12 | 3 | 14 | 1 | 15 |
| Comparative Example 5 (SPM) | Hydrogen peroxide (10) Water (130) | Sulfuric acid (10) | 70 | C | C | 50 | 9 | <1 | 10 | <0.1 | 10 |

TABLE 3

|  | Cleaning component 1 (g) | Cleaning component 2 (g) | Treatment temperature (° C.) | Resist stripping property (Bulk layer) | Resist stripping property (Hardened layer) | Al$_2$O$_3$ ER (A/min) | TiN ER (A/min) | HfO$_2$ ER (A/min) | SiGe40% ER (A/min) | Doped Si-Loss (A) | Ox growth (A) |
|---|---|---|---|---|---|---|---|---|---|---|---|
| Reference Example 1 | Ammonium carbonate (10) TMAH(1.25) Pure water (88.75) Surfactant W1(1) Hydrogen peroxide (50) | Citric acid (100) | 70 | C | B | 50 | 20 | <1 | 10 | <0.1 | 15 |
| Reference Example 2 | Ammonium carbonate (10) Pure water (15) Ethylene carbonate (75) Hydrogen peroxide (50) | Citric acid (100) | 70 | B | B | 35 | 14 | <1 | 7 | <0.1 | 9 |
| Reference Example 3 | 1,1,3,3-trimethyl guanidine (10) Pure water (25) Ethylene carbonate (65) | Hydrogen peroxide (50) | 70 | A | A | 30 | 11 | <1 | 7 | <0.1 | 8 |
| Reference Example 4 | Hydrogen peroxide (50) Ethylene carbonate(50) | — | 70 | B | C | Not evaluated | | | | | |
| Reference Example 5 | Ethylene carbonate (90) | Sulfuric acid (75) | 70 | B | B' | Not evaluated | | | | | |

Hydrogen peroxide: 30 mass % hydrogen peroxide solution
Sulfuric acid: 98 mass % sulfuric acid aqueous solution
Citric acid: 20 mass % citric acid aqueous solution
TMAH: Tetramethylammonium hydroxide
Surfactant W1: H(CH$_2$CH$_2$O)a(CH$_2$CH$_2$O)b(CH$_2$CH$_2$O)cH . . . a = 3, b = 5, c = 3

As is seen from Tables 1 to 3, the conventional SPM cleaning shows good result in the removal of a hardened layer, but cleanability of a resist itself was poor in the removal of a bulk layer. Damage to a substrate was also extremely large, and considering the recent high request level, this was the level of the practical problem. On the other hand, it is seen that the cleaning agents for a semiconductor substrate of the present invention (Examples) exert cleaning power equivalent to or more than the cleaning power of the SPM cleaning agent, and damages by the SPM cleaning agent for the semiconductor substrates constituted of various materials are greatly improved.

What is claimed is:

1. A cleaning agent for a semiconductor substrate, comprising sulfuric acid, hydrogen peroxide and an alkylene carbonate,
    the amount of sulfuric acid is from 5% by mass to 50% by mass in terms of 98 mass % sulfuric acid aqueous solution, based on the total mass of the cleaning agent, and
    the amount of hydrogen peroxide is from 5% by mass to 50% by mass in terms of 30 mass % hydrogen peroxide solution, based on the total mass of the cleaning agent.

2. The cleaning agent for a semiconductor substrate according to claim 1, wherein the alkylene carbonate is ethylene carbonate or propylene carbonate.

3. The cleaning agent for a semiconductor substrate according to claim 1, wherein the alkylene carbonate is used in an amount of from 10 to 95% by mass based on the total mass of the cleaning agent.

4. The cleaning agent for a semiconductor substrate according to claim 1, wherein the cleaning agent is a multicomponent kit comprising a combination of sulfuric acid, hydrogen peroxide and the alkylene carbonate.

5. The cleaning agent for a semiconductor substrate according to claim 1, wherein the cleaning agent is a two-component kit comprising a mixture of hydrogen peroxide and the alkylene carbonate, and sulfuric acid.

6. The cleaning agent for a semiconductor substrate according to claim 1, further comprising a sulfonate group-containing compound.

7. The cleaning agent for a semiconductor substrate according to claim 5, wherein the mixture further comprises a sulfonate group-containing compound.

* * * * *